(12) United States Patent
Do et al.

(10) Patent No.: US 8,487,445 B1
(45) Date of Patent: Jul. 16, 2013

(54) SEMICONDUCTOR DEVICE HAVING THROUGH ELECTRODES PROTRUDING FROM DIELECTRIC LAYER

(75) Inventors: Won Chul Do, Kyunggi-do (KR); Yeon Seung Jung, Seoul (KR); Yong Jae Ko, Gwangju (KR)

(73) Assignee: Amkor Technology, Inc., Chandler, AZ (US)

( * ) Notice: Subject to any disclaimer, the term of this patent is extended or adjusted under 35 U.S.C. 154(b) by 9 days.

(21) Appl. No.: 12/898,192

(22) Filed: Oct. 5, 2010

(51) Int. Cl.
  *H01L 23/48* (2006.01)

(52) U.S. Cl.
  USPC .................... 257/774; 257/773; 257/E23.011

(58) Field of Classification Search
  USPC .................................. 257/773–776, E23.011
  See application file for complete search history.

(56) References Cited

U.S. PATENT DOCUMENTS

| | | | |
|---|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,394,712 A | 7/1983 | Anthony |
| 4,417,266 A | 11/1983 | Grabbe |
| 4,451,224 A | 5/1984 | Harding |
| 4,499,655 A | 2/1985 | Anthony |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,729,061 A | 3/1988 | Brown |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |

(Continued)

FOREIGN PATENT DOCUMENTS

| DE | 197 34 794 | 7/1998 |
|---|---|---|
| EP | 0 393 997 | 10/1990 |

(Continued)

OTHER PUBLICATIONS

Hiner et al., "Through Via Recessed Reveal Structure and Method", U.S. Appl. No. 12/985,888, filed Jan. 6, 2011.

(Continued)

*Primary Examiner* — Tucker Wright
(74) *Attorney, Agent, or Firm* — McKay and Hodgson, LLP; Scott J. Hodgson (57) ABSTRACT

A semiconductor device and a manufacturing method thereof are provided. In one embodiment of the manufacturing method of the semiconductor device, a through electrode is formed on a semiconductor die, and a dielectric layer such as a photopolymer is coated on the through electrode to cover the through electrode. Under exposure is performed on the dielectric layer, thereby partially removing the dielectric layer by development. As a result, a top end of the through electrode is exposed to the outside or protrudes through the dielectric layer. The dielectric layer remaining on the top end of the through electrode may be removed by performing a plasma descum process, if needed.

16 Claims, 7 Drawing Sheets

U.S. PATENT DOCUMENTS

| | | |
|---|---|---|
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga et al. |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,229,647 A | 7/1993 | Gnadinger |
| 5,245,751 A | 9/1993 | Locke et al. |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,268,310 A | 12/1993 | Goodrich et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,353,498 A | 10/1994 | Fillion et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,394,303 A | 2/1995 | Yamaji |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | Lemaire et al. |
| 5,424,576 A | 6/1995 | Djennas et al. |
| 5,428,248 A | 6/1995 | Cha |
| 5,432,677 A | 7/1995 | Mowatt et al. |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,576,517 A | 11/1996 | Wojnarowski et al. |
| 5,578,525 A | 11/1996 | Mizukoshi |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,264 A | 3/1997 | Gaul |
| 5,608,265 A | 3/1997 | Kitano et al. |
| 5,608,267 A | 3/1997 | Mahulikar et al. |
| 5,619,068 A | 4/1997 | Benzoni |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita et al. |
| 5,736,432 A | 4/1998 | Mackessy |
| 5,736,448 A | 4/1998 | Saia et al. |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,769,989 A | 6/1998 | Hoffmeyer et al. |
| 5,770,888 A | 6/1998 | Song et al. |
| 5,776,798 A | 7/1998 | Quan et al. |
| 5,783,861 A | 7/1998 | Son |
| 5,786,238 A | 7/1998 | Pai et al. |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,841,193 A | 11/1998 | Eichelberger |
| 5,844,306 A | 12/1998 | Fujita et al. |
| 5,856,911 A | 1/1999 | Riley |
| 5,859,471 A | 1/1999 | Kuraishi et al. |
| 5,859,475 A | 1/1999 | Freyman et al. |
| 5,866,939 A | 2/1999 | Shin et al. |
| 5,871,782 A | 2/1999 | Choi |
| 5,874,770 A | 2/1999 | Saia et al. |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |
| 5,917,242 A | 6/1999 | Ball |
| 5,937,324 A | 8/1999 | Abercrombie et al. |
| 5,939,779 A | 8/1999 | Kim |
| 5,942,794 A | 8/1999 | Okumura et al. |

| | | | | | | |
|---|---|---|---|---|---|---|
| 5,951,305 | A | 9/1999 | Haba | 6,294,830 B1 | 9/2001 | Fjelstad |
| 5,959,356 | A | 9/1999 | Oh | 6,295,977 B1 | 10/2001 | Ripper et al. |
| 5,969,426 | A | 10/1999 | Baba et al. | 6,297,548 B1 | 10/2001 | Moden et al. |
| 5,973,388 | A | 10/1999 | Chew et al. | 6,303,984 B1 | 10/2001 | Corisis |
| 5,976,912 | A | 11/1999 | Fukutomi et al. | 6,303,997 B1 | 10/2001 | Lee |
| 5,977,613 | A | 11/1999 | Takata et al. | 6,307,272 B1 | 10/2001 | Takahashi et al. |
| 5,977,615 | A | 11/1999 | Yamaguchi et al. | 6,309,909 B1 | 10/2001 | Ohgiyama |
| 5,977,630 | A | 11/1999 | Woodworth et al. | 6,316,822 B1 | 11/2001 | Venkateshwaran et al. |
| 5,981,314 | A | 11/1999 | Glenn et al. | 6,316,838 B1 | 11/2001 | Ozawa et al. |
| 5,982,632 | A | 11/1999 | Mosley et al. | 6,323,550 B1 | 11/2001 | Martin et al. |
| 5,986,333 | A | 11/1999 | Nakamura | 6,326,243 B1 | 12/2001 | Suzuya et al. |
| 5,986,885 | A | 11/1999 | Wyland | 6,326,244 B1 | 12/2001 | Brooks et al. |
| 6,001,671 | A | 12/1999 | Fjelstad | 6,326,678 B1 | 12/2001 | Karnezos et al. |
| 6,013,947 | A | 1/2000 | Lim | 6,335,564 B1 | 1/2002 | Pour |
| 6,018,189 | A | 1/2000 | Mizuno | 6,337,510 B1 | 1/2002 | Chun-Jen et al. |
| 6,020,625 | A | 2/2000 | Qin et al. | 6,339,255 B1 | 1/2002 | Shin |
| 6,025,640 | A | 2/2000 | Yagi et al. | 6,348,726 B1 | 2/2002 | Bayan et al. |
| 6,031,279 | A | 2/2000 | Lenz | 6,355,502 B1 | 3/2002 | Kang et al. |
| RE36,613 | E | 3/2000 | Ball | 6,365,974 B1 | 4/2002 | Abbott et al. |
| 6,034,423 | A | 3/2000 | Mostafazadeh et al. | 6,369,447 B2 | 4/2002 | Mori |
| 6,040,626 | A | 3/2000 | Cheah et al. | 6,369,454 B1 | 4/2002 | Chung |
| 6,043,430 | A | 3/2000 | Chun | 6,373,127 B1 | 4/2002 | Baudouin et al. |
| 6,060,768 | A | 5/2000 | Hayashida et al. | 6,379,982 B1 | 4/2002 | Ahn et al. |
| 6,060,769 | A | 5/2000 | Wark | 6,380,048 B1 | 4/2002 | Boon et al. |
| 6,072,228 | A | 6/2000 | Hinkle et al. | 6,384,472 B1 | 5/2002 | Huang |
| 6,075,284 | A | 6/2000 | Choi et al. | 6,388,336 B1 | 5/2002 | Venkateshwaran et al. |
| 6,081,029 | A | 6/2000 | Yamaguchi | 6,395,578 B1 | 5/2002 | Shin et al. |
| 6,084,310 | A | 7/2000 | Mizuno et al. | 6,396,148 B1 | 5/2002 | Eichelberger et al. |
| 6,087,715 | A | 7/2000 | Sawada et al. | 6,396,153 B2 | 5/2002 | Fillion et al. |
| 6,087,722 | A | 7/2000 | Lee et al. | 6,400,004 B1 | 6/2002 | Fan et al. |
| 6,100,594 | A | 8/2000 | Fukui et al. | 6,406,934 B1 | 6/2002 | Glenn et al. |
| 6,113,474 | A | 9/2000 | Shih et al. | 6,410,979 B2 | 6/2002 | Abe |
| 6,114,752 | A | 9/2000 | Huang et al. | 6,414,385 B1 | 7/2002 | Huang et al. |
| 6,118,174 | A | 9/2000 | Kim | 6,420,779 B1 | 7/2002 | Sharma et al. |
| 6,118,184 | A | 9/2000 | Ishio et al. | 6,429,508 B1 | 8/2002 | Gang |
| RE36,907 | E | 10/2000 | Templeton, Jr. et al. | 6,429,509 B1 | 8/2002 | Hsuan |
| 6,130,115 | A | 10/2000 | Okumura et al. | 6,437,429 B1 | 8/2002 | Su et al. |
| 6,130,473 | A | 10/2000 | Mostafazadeh et al. | 6,444,499 B1 | 9/2002 | Swiss et al. |
| 6,133,623 | A | 10/2000 | Otsuki et al. | 6,448,633 B1 | 9/2002 | Yee et al. |
| 6,140,154 | A | 10/2000 | Hinkle et al. | 6,448,661 B1 | 9/2002 | Kim et al. |
| 6,143,981 | A | 11/2000 | Glenn | 6,452,279 B2 | 9/2002 | Shimoda |
| 6,168,969 | B1 | 1/2001 | Farnworth | 6,459,148 B1 | 10/2002 | Chun-Jen et al. |
| 6,169,329 | B1 | 1/2001 | Farnworth et al. | 6,464,121 B2 | 10/2002 | Reijnders |
| 6,177,718 | B1 | 1/2001 | Kozono | 6,476,469 B2 | 11/2002 | Hung et al. |
| 6,181,002 | B1 | 1/2001 | Juso et al. | 6,476,474 B1 | 11/2002 | Hung |
| 6,184,465 | B1 | 2/2001 | Corisis | 6,482,680 B1 | 11/2002 | Khor et al. |
| 6,184,573 | B1 | 2/2001 | Pu | 6,498,099 B1 | 12/2002 | McLellan et al. |
| 6,194,250 | B1 | 2/2001 | Melton et al. | 6,498,392 B2 | 12/2002 | Azuma |
| 6,194,777 | B1 | 2/2001 | Abbott et al. | 6,507,096 B2 | 1/2003 | Gang |
| 6,197,615 | B1 | 3/2001 | Song et al. | 6,507,120 B2 | 1/2003 | Lo et al. |
| 6,198,171 | B1 | 3/2001 | Huang et al. | 6,521,530 B2 | 2/2003 | Peters et al. |
| 6,201,186 | B1 | 3/2001 | Daniels et al. | 6,524,885 B2 | 2/2003 | Pierce |
| 6,201,292 | B1 | 3/2001 | Yagi et al. | 6,534,849 B1 | 3/2003 | Gang |
| 6,204,554 | B1 | 3/2001 | Ewer et al. | 6,545,332 B2 | 4/2003 | Huang |
| 6,208,020 | B1 | 3/2001 | Minamio et al. | 6,545,345 B1 | 4/2003 | Glenn et al. |
| 6,208,021 | B1 | 3/2001 | Ohuchi et al. | 6,559,525 B2 | 5/2003 | Huang |
| 6,208,023 | B1 | 3/2001 | Nakayama et al. | 6,566,168 B2 | 5/2003 | Gang |
| 6,211,462 | B1 | 4/2001 | Carter, Jr. et al. | 6,573,461 B2 | 6/2003 | Roeters et al. |
| 6,214,525 | B1 | 4/2001 | Boyko et al. | 6,577,013 B1 | 6/2003 | Glenn et al. |
| 6,218,731 | B1 | 4/2001 | Huang et al. | 6,583,503 B2 | 6/2003 | Akram et al. |
| 6,222,258 | B1 | 4/2001 | Asano et al. | 6,593,645 B2 | 7/2003 | Shih et al. |
| 6,222,259 | B1 | 4/2001 | Park et al. | 6,603,196 B2 | 8/2003 | Lee et al. |
| 6,225,146 | B1 | 5/2001 | Yamaguchi et al. | 6,608,371 B2 | 8/2003 | Kurashima et al. |
| 6,229,200 | B1 | 5/2001 | Mclellan et al. | 6,624,005 B1 | 9/2003 | DiCaprio et al. |
| 6,229,205 | B1 | 5/2001 | Jeong et al. | 6,667,546 B2 | 12/2003 | Huang et al. |
| 6,239,367 | B1 | 5/2001 | Hsuan et al. | 6,671,398 B2 | 12/2003 | Reinhorn et al. |
| 6,239,384 | B1 | 5/2001 | Smith et al. | 6,727,576 B2 | 4/2004 | Hedler et al. |
| 6,242,281 | B1 | 6/2001 | Mclellan et al. | 6,730,857 B2 | 5/2004 | Konrad et al. |
| 6,256,200 | B1 | 7/2001 | Lam et al. | 6,740,964 B2 | 5/2004 | Sasaki |
| 6,258,192 | B1 | 7/2001 | Natarajan | 6,780,770 B2 | 8/2004 | Larson |
| 6,258,629 | B1 | 7/2001 | Niones et al. | 6,831,371 B1 | 12/2004 | Huemoeller et al. |
| 6,261,918 | B1 | 7/2001 | So | 6,838,776 B1 | 1/2005 | Leal et al. |
| 6,281,566 | B1 | 8/2001 | Magni | 6,845,554 B2 | 1/2005 | Frankowsky et al. |
| 6,281,568 | B1 | 8/2001 | Glenn et al. | 6,853,572 B1 | 2/2005 | Sabharwal |
| 6,282,095 | B1 | 8/2001 | Houghton et al. | 6,873,054 B2 | 3/2005 | Miyazawa et al. |
| 6,285,075 | B1 | 9/2001 | Combs et al. | 6,905,914 B1 | 6/2005 | Huemoeller et al. |
| 6,291,271 | B1 | 9/2001 | Lee et al. | 6,919,514 B2 | 7/2005 | Konrad et al. |
| 6,291,273 | B1 | 9/2001 | Miyaki et al. | 6,921,975 B2 | 7/2005 | Leal et al. |
| 6,294,100 | B1 | 9/2001 | Fan et al. | 6,930,256 B1 | 8/2005 | Huemoeller et al. |

| | | |
|---|---|---|
| 7,015,075 B2 | 3/2006 | Fay et al. |
| 7,022,609 B2 | 4/2006 | Yamamoto et al. |
| 7,041,534 B2 | 5/2006 | Chao et al. |
| 7,129,158 B2 | 10/2006 | Nakai |
| 7,151,009 B2 | 12/2006 | Kim et al. |
| 7,190,062 B1 | 3/2007 | Sheridan et al. |
| 7,192,807 B1 | 3/2007 | Huemoeller et al. |
| 7,208,838 B2 | 4/2007 | Masuda |
| 7,223,634 B2 | 5/2007 | Yamaguchi |
| 7,242,081 B1 | 7/2007 | Lee |
| 7,247,523 B1 | 7/2007 | Huemoeller et al. |
| 7,272,444 B2 | 9/2007 | Peterson et al. |
| 7,345,361 B2 | 3/2008 | Mallik et al. |
| 7,361,533 B1 | 4/2008 | Huemoeller et al. |
| 7,372,151 B1 | 5/2008 | Fan et al. |
| 7,420,272 B1 | 9/2008 | Huemoeller et al. |
| 7,572,681 B1 | 8/2009 | Huemoeller et al. |
| 7,632,753 B1 | 12/2009 | Rusli et al. |
| 7,692,286 B1 | 4/2010 | Huemoeller et al. |
| 7,714,431 B1 | 5/2010 | Huemoeller et al. |
| 7,723,210 B2 | 5/2010 | Berry et al. |
| 7,777,351 B1 | 8/2010 | Berry et al. |
| 7,843,052 B1 | 11/2010 | Yoo et al. |
| 7,843,072 B1 | 11/2010 | Park et al. |
| 7,932,595 B1 | 4/2011 | Huemoeller et al. |
| 7,973,415 B2 | 7/2011 | Kawashita et al. |
| 8,209,856 B2 | 7/2012 | Mori et al. |
| 2001/0008305 A1 | 7/2001 | McLellan et al. |
| 2001/0011654 A1 | 8/2001 | Schmidt et al. |
| 2001/0012704 A1 | 8/2001 | Eldridge |
| 2001/0014538 A1 | 8/2001 | Kwan et al. |
| 2002/0017710 A1 | 2/2002 | Kurashima et al. |
| 2002/0024122 A1 | 2/2002 | Jung et al. |
| 2002/0027297 A1 | 3/2002 | Ikenaga et al. |
| 2002/0030245 A1 | 3/2002 | Hanaoka et al. |
| 2002/0061642 A1 | 5/2002 | Haji et al. |
| 2002/0140061 A1 | 10/2002 | Lee |
| 2002/0140068 A1 | 10/2002 | Lee et al. |
| 2002/0163015 A1 | 11/2002 | Lee et al. |
| 2003/0013232 A1 | 1/2003 | Towle et al. |
| 2003/0030131 A1 | 2/2003 | Lee et al. |
| 2003/0038344 A1 | 2/2003 | Palmer et al. |
| 2003/0064548 A1 | 4/2003 | Isaak |
| 2003/0073265 A1 | 4/2003 | Hu et al. |
| 2003/0085460 A1 | 5/2003 | Siniaguine |
| 2003/0134455 A1 | 7/2003 | Cheng et al. |
| 2003/0207566 A1 | 11/2003 | Forbes et al. |
| 2004/0004293 A1 | 1/2004 | Murayama |
| 2004/0026781 A1 | 2/2004 | Nakai |
| 2004/0046244 A1 | 3/2004 | Nakamura et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0113260 A1 | 6/2004 | Sunohara et al. |
| 2004/0192033 A1 | 9/2004 | Hara |
| 2004/0251554 A1 | 12/2004 | Masuda |
| 2005/0029630 A1* | 2/2005 | Matsuo ......................... 257/628 |
| 2005/0046002 A1 | 3/2005 | Lee et al. |
| 2005/0104181 A1 | 5/2005 | Lee et al. |
| 2005/0242425 A1 | 11/2005 | Leal et al. |
| 2005/0263869 A1 | 12/2005 | Tanaka et al. |
| 2005/0282314 A1 | 12/2005 | Lo et al. |
| 2007/0007639 A1 | 1/2007 | Fukazawa |
| 2007/0164443 A1* | 7/2007 | Florian et al. ................. 257/774 |
| 2007/0273049 A1 | 11/2007 | Khan et al. |
| 2007/0290376 A1 | 12/2007 | Zhao et al. |
| 2008/0230887 A1 | 9/2008 | Sun et al. |
| 2008/0277799 A1 | 11/2008 | Benson et al. |
| 2009/0020865 A1 | 1/2009 | Su |
| 2009/0039527 A1 | 2/2009 | Chan et al. |
| 2010/0008058 A1 | 1/2010 | Saen et al. |
| 2010/0059855 A1 | 3/2010 | Lin et al. |
| 2012/0018868 A1 | 1/2012 | Oganesian et al. |
| 2012/0175784 A1 | 7/2012 | Lin et al. |

FOREIGN PATENT DOCUMENTS

| | | |
|---|---|---|
| EP | 0 459 493 | 12/1991 |
| EP | 0 720 225 | 7/1996 |
| EP | 0 720 234 | 7/1996 |
| EP | 0 794 572 | 9/1997 |
| EP | 0 844 665 | 5/1998 |
| EP | 0 936 671 | 8/1999 |
| EP | 0 989 608 | 3/2000 |
| EP | 1 032 037 | 8/2000 |
| JP | 55-163868 | 12/1980 |
| JP | 57-045959 | 3/1982 |
| JP | 59-208756 | 11/1984 |
| JP | 59-227143 | 12/1984 |
| JP | 60-010756 | 1/1985 |
| JP | 60-116239 | 6/1985 |
| JP | 60-195957 | 10/1985 |
| JP | 60-231349 | 11/1985 |
| JP | 61-039555 | 2/1986 |
| JP | 62-009639 | 1/1987 |
| JP | 63-033854 | 2/1988 |
| JP | 63-067762 | 3/1988 |
| JP | 63-188964 | 8/1988 |
| JP | 63-205935 | 8/1988 |
| JP | 63-233555 | 9/1988 |
| JP | 63-249345 | 10/1988 |
| JP | 63-289951 | 11/1988 |
| JP | 63-316470 | 12/1988 |
| JP | 64-054749 | 3/1989 |
| JP | 01-106456 | 4/1989 |
| JP | 01-175250 | 7/1989 |
| JP | 01-205544 | 8/1989 |
| JP | 01-251747 | 10/1989 |
| JP | 02-129948 | 5/1990 |
| JP | 03-069248 | 7/1991 |
| JP | 03-177060 | 8/1991 |
| JP | 04-098864 | 3/1992 |
| JP | 05-129473 | 5/1993 |
| JP | 05-166992 | 7/1993 |
| JP | 05-283460 | 10/1993 |
| JP | 06-092076 | 4/1994 |
| JP | 06-140563 | 5/1994 |
| JP | 06-260532 | 9/1994 |
| JP | 07-297344 | 11/1995 |
| JP | 07-312405 | 11/1995 |
| JP | 08-064634 | 3/1996 |
| JP | 08-083877 | 3/1996 |
| JP | 08-125066 | 5/1996 |
| JP | 08-222682 | 8/1996 |
| JP | 08-306853 | 11/1996 |
| JP | 09-008205 | 1/1997 |
| JP | 09-008206 | 1/1997 |
| JP | 09-008207 | 1/1997 |
| JP | 09-092775 | 4/1997 |
| JP | 09-293822 | 11/1997 |
| JP | 10-022447 | 1/1998 |
| JP | 10-163401 | 6/1998 |
| JP | 10-199934 | 7/1998 |
| JP | 10-256240 | 9/1998 |
| JP | 2000-150765 | 5/2000 |
| JP | 2000-556398 | 10/2000 |
| JP | 2001-060648 | 3/2001 |
| JP | 2002-043497 | 2/2002 |
| KR | 1994-0001979 | 1/1994 |
| KR | 10-0220154 | 6/1999 |
| KR | 2002-0049944 | 6/2002 |
| WO | WO 99/56316 | 11/1999 |
| WO | WO 99/67821 | 12/1999 |

OTHER PUBLICATIONS

Kim et al., "Application of Through Mold Via (TMV) as PoP base package", *58th ECTC Proceedings*, May 2008, Lake Buena Vista, FL, 6 pages, IEEE.

Scanlan, "Package-on-package (PoP) with Through-mold Vias", *Advanced Packaging*, Jan. 2008, 3 pages, vol. 17, Issue 1, PennWell Corporation.

Huemoeller et al., "Integrated Circuit Film Substrate Having Embedded Conductive Patterns and Vias", U.S. Appl. No. 10/261,868, filed Oct. 1, 2002.

Berry et al., "Direct-write Wafer Level Chip Scale Package", U.S. Appl. No. 11/289,826, filed Nov. 29, 2005.

Lee et al., "Substrate for Semiconductor Device and Manufacturing Method Thereof", U.S. Appl. No. 11/440,548, filed May 24, 2006.

Huemoeller et al., "Embedded Electronic Component Package Fabrication Method", U.S. Appl. No. 12/459,532, filed Jul. 2, 2009.

Berry et al., "Direct-Write Wafer Level Chip Scale Package", U.S. Appl. No. 12/661,597, filed Mar. 19, 2010.

Huemoeller et al., "Through Via Nub Reveal Method and Structure", U.S. Appl. No. 12/754,837, filed Apr. 6, 2010.

Hiner et al., "Through Via Connected Backside Embedded Circuit Features Structure and Method", U.S. Appl. No. 12/848,820, filed Aug. 2, 2010.

Huemoeller et al., "Through Via Nub Reveal Method and Structure," U.S. Appl. No. 13/663,208, filed Oct. 29, 2012.

Hiner et al., "Through Via Recessed Reveal Structure and Method," U.S. Appl. No. 13/756,167, filed Jan. 31, 2013.

* cited by examiner

SEMICONDUCTOR DEVICE HAVING THROUGH ELECTRODES PROTRUDING FROM DIELECTRIC LAYER

TECHNICAL FIELD

One embodiment relates to a semiconductor device and a manufacturing method thereof.

BACKGROUND

In pace with consumers' demands, a recent trend in the information technology (IT) industry is moving toward compactness and convenience, and semiconductor devices have been continuously required to be more miniaturized or designed into modules accordingly. Such changes have resulted in development of device fabrication techniques and require further advanced processing technology.

A typical exemplary semiconductor device satisfying such a new trend is an SIP (System In Package), in which semiconductor dies each having a characteristic function are packaged into a single device, or multiple devices are stacked and fabricated into modules.

Recently, in order to stack the same or different semiconductor dies, which is an essential process for the SIP technology, a chiefly researched process is a TSV (Through-Silicon-Vias) process, in which semiconductor dies are interconnected in a longitudinal direction by forming through-holes on a silicon wafer. Here, known techniques of forming through-holes for the TSV include laser drilling, wet etching, dry etching, and so on.

BRIEF DESCRIPTION OF THE DRAWINGS

Common reference numerals are used throughout the drawings and the detailed description to indicate the same elements.

DETAILED DESCRIPTION

Figure 1:
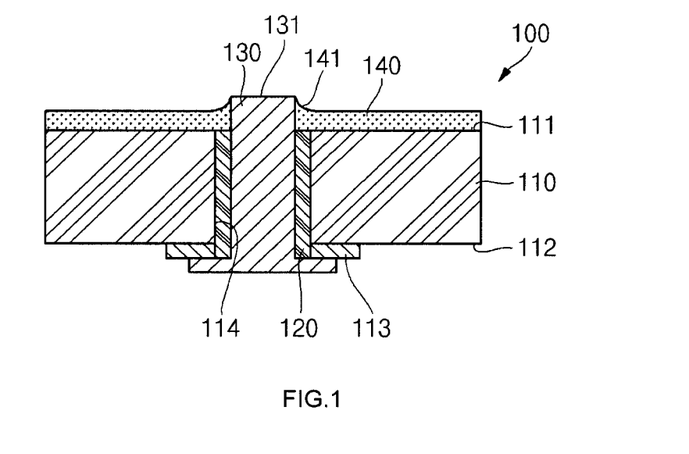
FIG. 1 is a cross-sectional view of a semiconductor device according to one embodiment.

Referring to FIG. 1, a cross-sectional view of a semiconductor device 100 according to one embodiment is illustrated.

As illustrated in FIG. 1, the semiconductor device 100 includes a semiconductor die 110, an insulation layer 120, a through electrode 130, and a dielectric layer 140.

The semiconductor die 110 includes a first surface 111 having an approximately planar shape, a second surface 112, opposite to the first surface 111 and having an approximately planar shape, a conductive pad 113 formed on the second surface 112, and a through-hole 114 formed through the first surface 111 and the conductive pad 113. Here, the conductive pad 113 may be any one selected from a common bond pad, a redistribution layer, and equivalents thereof, but the kind of the conductive pad 113 is not limited to that illustrated herein. In addition, the semiconductor die 110 includes an active region (not shown) having a plurality of circuit devices and circuit patterns formed therein. Further, an inactive region is formed outside the active region, and the through-hole 114 is formed in the inactive region that does not affect operations of circuit devices or the circuit patterns. In addition, the active region is electrically connected to the conductive pad 113.

The insulation layer 120 is formed on an inner wall of the through-hole 114. That is to say, the insulation layer 120 is formed on the inner wall of the through-hole 114 formed through the first surface 111 and the conductive pad 113 to a predetermined thickness. The insulation layer 120 prevents the through electrode 130 from being shorted to the active region or the inactive region of the semiconductor die 110, i.e., the insulation layer 120 electrically isolates the through electrode 130 from the bulk of the semiconductor die 110. The insulation layer 120 may be any one selected from silicon oxide, silicon nitride, a polymer, and equivalents thereof, but the kind of the insulation layer 120 is not limited to that illustrated herein.

The through electrode 130 is formed inside the insulation layer 120, while upwardly protruding a predetermined length from the first surface 111 of the semiconductor die 110 or downwardly protruding a predetermined length from the conductive pad 113 of the semiconductor die 110. The through electrode 130 is electrically connected to the conductive pad 113. Therefore, the through electrode 130 covers a surface of the conductive pad 113. In addition, the through electrode 130 may be any one selected from copper (Cu), aluminum (Al), gold (Au), silver (Ag), and equivalents thereof, but the material of the through electrode 130 is not limited to that illustrated herein. The through electrode 130 is electrically connected to the circuit devices or the circuit patterns in the active region through the conductive pad 113. The through electrode 130 may further include a barrier or seed layer formed on the inner wall of the insulation layer 120.

The dielectric layer 140 is formed on the first surface 111 of the semiconductor die 110. The dielectric layer 140 has a thickness smaller than that of the through electrode 130 protruding through the first surface 111. Therefore, a top end 131 of the through electrode 130 is exposed to the outside or protrudes through the dielectric layer 140. In addition, the dielectric layer 140 formed outside the through electrode 130 has a curved surface 141 extending toward downward and lateral sides. The curved surface 141, which is formed in a special manufacturing process according to embodiments, serves to surround the lateral surface of the through electrode 130. Here, the dielectric layer 140 may be any one selected from a polymer and equivalents thereof, but the material of the dielectric layer 140 is not limited to that illustrated herein.

In such a manner, one embodiment provides a semiconductor device having a plurality of semiconductor dies 110 vertically stackable using the through electrode 130, not using a wire connection method. In addition, in one embodiment, since the top end 131 of the through electrode 130 is exposed to the outside or protrudes through the dielectric layer 140, it is not necessary to form a separate conductive pattern on the through electrode 130. However, in one embodiment, to enhance vertical stacking of a plurality of semiconductor dies 110, a coating, e.g., plating, is applied to top end 131 such as a nickel-gold (NiAu) plating, a nickel-palladium-gold (NiPdAu) plating, or a tin (Sn) plating or other plating.

Figure 2:
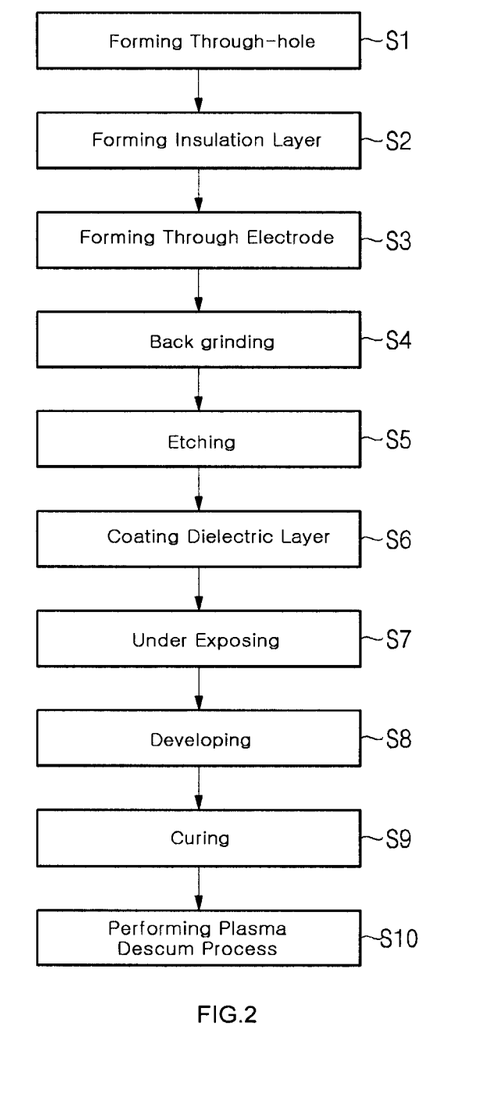
FIG. 2 is a flowchart of a manufacturing method of a semiconductor device according to another embodiment.

Referring to FIG. 2, a manufacturing method of the semiconductor device 100 according to another embodiment is illustrated.

As illustrated in FIG. 2, the manufacturing method of the semiconductor device 100 according to another embodiment includes a forming through-hole operation S1, a forming insulation layer operation S2, a forming through electrode operation S3, a back grinding operation S4, an etching operation S5, a coating dielectric layer operation S6, an under exposing operation S7, a developing operation S8, a curing operation S9, and a performing plasma descum process operation S10.

Referring to FIGS. 3A through 3J, the manufacturing method of the semiconductor device 100 according to another embodiment is illustrated.

Figure 3A:
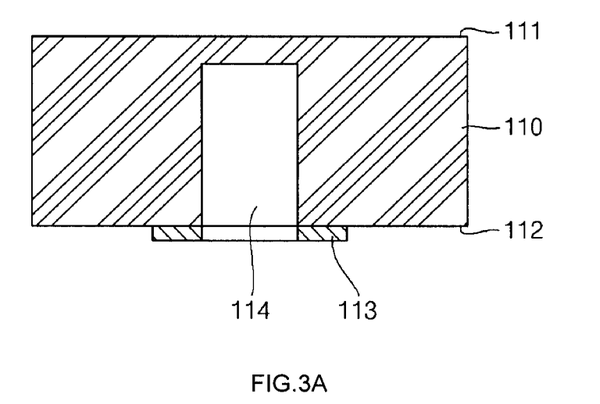
FIGS. 3A, 3B, 3C, 3D, 3E, 3F, 3G, 3H, 3I, 3J are cross-sectional views of the manufacturing method of the semiconductor device according to another embodiment.

In forming through-hole operation S1, as illustrated in FIG. 3A, a through-hole 114 having a predetermined depth is formed in a semiconductor die 110 having a first surface 111, a second surface 112 and a conductive pad 113. Here, the through-hole 114 may be formed by any one process selected from laser drilling, wet etching, dry etching, and equivalents thereof, but the process of the through-hole 114 is not limited to that illustrated herein. Unlike the wet etching or the dry etching, however, the laser drilling does not require forming a mask or performing a photography process. Rather, according to the laser drilling, the depth and width of the through-hole 114 can be relatively easily set. FIG. 3A illustrates that the depth of the through-hole 114 is substantially the same as the thickness of the semiconductor die 110. In practice, however, it should be appreciated that the depth of the through-hole 114 is considerably smaller than that of the semiconductor die 110.

Figure 3B:
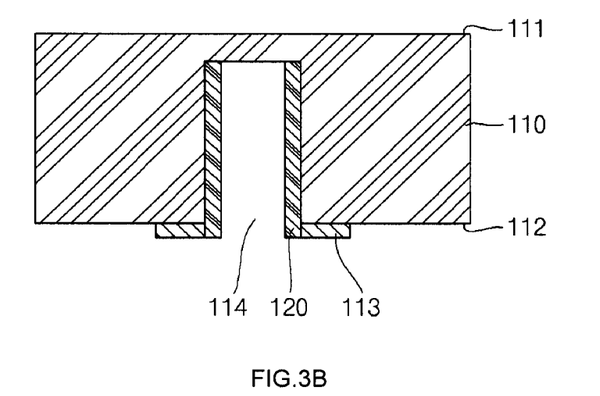

In forming insulation layer operation S2, as illustrated in FIG. 3B, an insulation layer 120 having a predetermined thickness is formed on an inner wall of the through-hole 114. The insulation layer 120 may be formed of silicon oxide ($SiO_x$) or silicon nitride ($SiN_x$) by chemical vapor deposition (CVD), or a polymer by spin coating or sublimation, but the formation method of the insulation layer 120 is not limited to that illustrated herein.

Figure 3C:
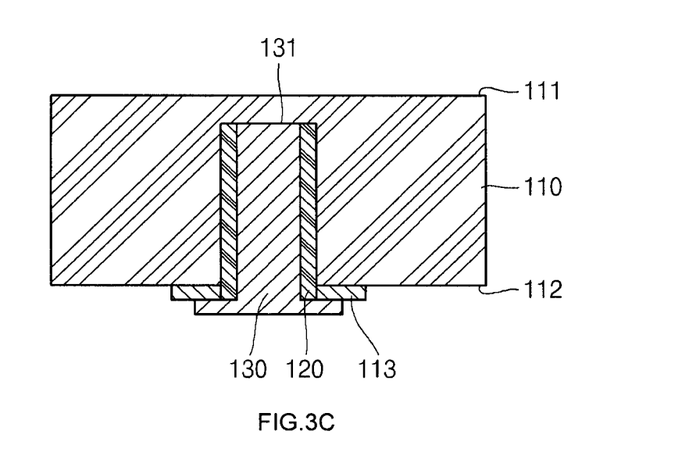

In forming through electrode operation S3, as illustrated in FIG. 3C, the inner wall of the through-hole 114 is filled with a conductive material to form a through electrode 130. The conductive material may be any one selected from copper (Cu), aluminum (Al), gold (Au), silver (Ag), and equivalents thereof, but the material of the conductive material is not limited to that illustrated herein.

Prior to the formation of the through electrode 130, a barrier and/or seed layer (not shown) may be formed on the inner wall of the insulation layer 120. The through electrode 130 may also be formed by plating. In addition, the through electrode 130 may be formed such that its bottom end covers the conductive pad 113, thereby allowing the through electrode 130 and the conductive pad 113 to be electrically connected to each other. Here, since the conductive pad 113 is electrically connected to the active region, the through electrode 130 is also electrically connected to the active region.

Meanwhile, the through electrode 130 is exposed to the outside through the first surface 111 of the semiconductor die 110, which is implemented by the following steps.

Figure 3D:
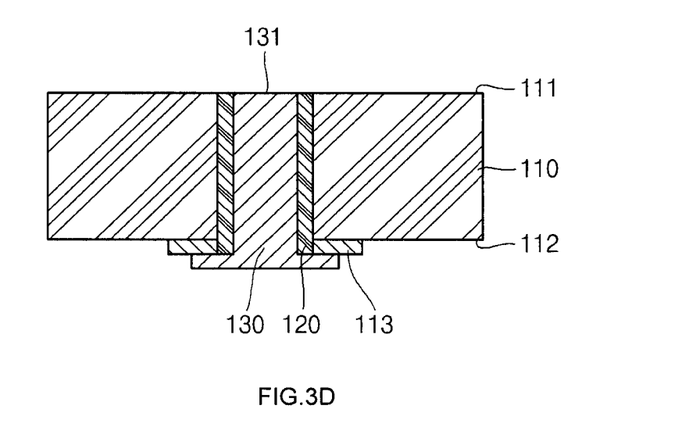

In back grinding operation S4, as illustrated in FIG. 3D, the first surface 111 of the semiconductor die 110 is subjected to back grinding until a top end 131 of the through electrode 130 is exposed. Since a region removed by the back grinding is an inactive region, rather than an active region, the semiconductor die 110 is not affected at all in operation even if the region is removed by the back grinding.

Figure 3E:
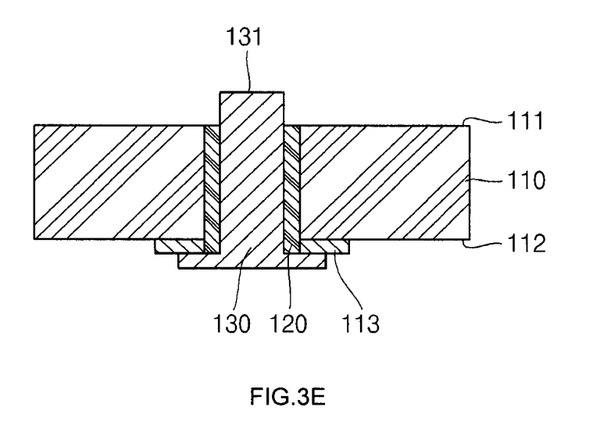

In etching operation S5, as illustrated in FIG. 3E, peripheral region of the through electrode 130 are etched using an etching solution or an etching gas that is not reactive with the through electrode 130 but is reactive with the semiconductor die 110 and the insulation layer 120. As a result, the through electrode 130 protrudes a predetermined length to the outside through the first surface 111 of the semiconductor die 110.

Figure 3F:
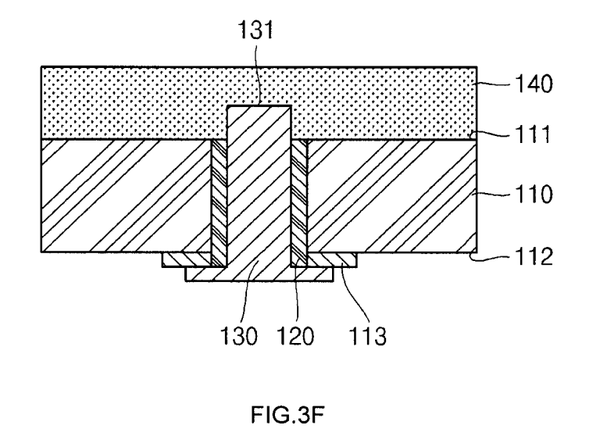

In coating dielectric layer operation S6, as illustrated in FIG. 3F, the dielectric layer 140 is coated on the first surface 111 of the semiconductor die 110 to a thickness enough to cover the through electrode 130. The dielectric layer 140 is formed by, for example, spin coating, but the coating method of the dielectric layer 140 is not limited to that illustrated herein. Here, the dielectric layer 140 may be a photopolymer. Upon being exposed to UV radiation, the photopolymer may be removed by developing.

Figure 3G:
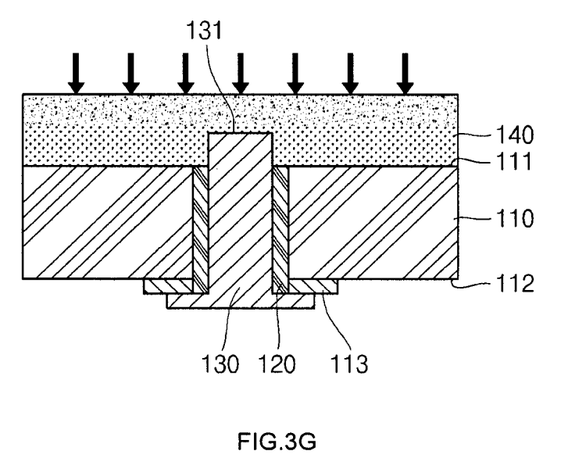

In under exposing operation S7, as illustrated in FIG. 3G, an under exposure dose, which is smaller than an appropriate exposure dose, is applied onto a surface of the dielectric layer 140. Here, the exposure dose (H) refers to a total energy quantity of UV radiation received by the dielectric layer 140 that is sensitive to the UV radiation, and may be expressed as intensity (I) of light applied to the dielectric layer 140 (brightness) multiplied by an exposure time (t), i.e., H=I*t, where 'H' denotes an exposure dose, 'I' denotes light intensity, and 't' denotes an exposure time, respectively.

In addition, the appropriate exposure dose refers to a minimum exposure dose required to completely remove the dielectric layer 140 from the first surface 111 of the semiconductor die 110 assuming that the developing of the dielectric layer 140 is performed at a preset temperature for a preset time. Stated another way, the appropriate exposure dose is the exposure dose which will result in the complete removal of the dielectric layer 140 during developing. The under exposure dose refers to a low dosage that is insufficient to reach the appropriate exposure dose, so that some of the dielectric layer 140 will remain on the first surface 111 of the semiconductor die 110 even when the dielectric layer 140 is developed at a preset temperature for a preset time, i.e., is developed such that the dielectric layer 140 would be completely removed with the appropriate exposure dose.

The under exposure dose for the dielectric layer 140 may vary according to the kind and thickness of the dielectric layer 140. Therefore, previous experiments are carried out many times with kinds and thicknesses of the dielectric layer 140 varying, thereby obtaining the under exposure dose for seeking a desired thickness of the remaining dielectric layer 140.

In addition, under exposing operation S7 may be performed over the entire wafer having a plurality of semiconductor dies without using a mask. Therefore, the cost required in the conventional process using masks can be reduced, and the overall manufacturing process can be considerably simplified.

Figure 3H:
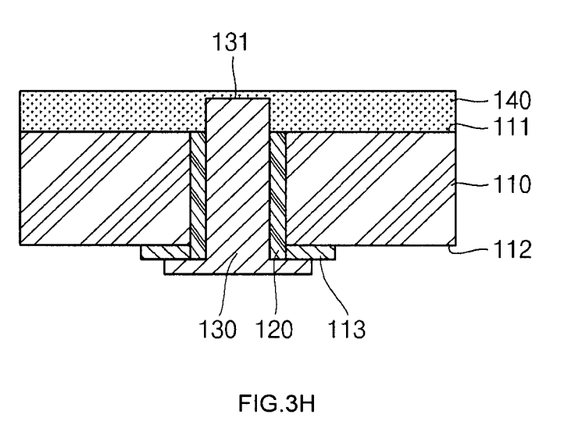

Further, under exposing operation S7 may not be necessarily performed. That is to say, developing operation S8 may be performed immediately after coating dielectric layer operation S6, without performing under exposing operation S7. In this case, appropriate processing parameters are necessary to develop only a region of the dielectric layer 140 for removal.

In developing operation S8, as illustrated in FIG. 3H, the developing is performed using a general developing solution, thereby removing a partially removed region of the dielectric layer 140. A thickness of the dielectric layer 140 remaining, sometimes called a remaining dielectric layer 140, by developing operation S8 is equal to or greater than a thickness of the through electrode 130 protruding through the first surface 111. Of course, as the result of the developing, a top end 131 of the through electrode 130 may be exposed or protrude to the outside of the dielectric layer 140.

Figure 3I:
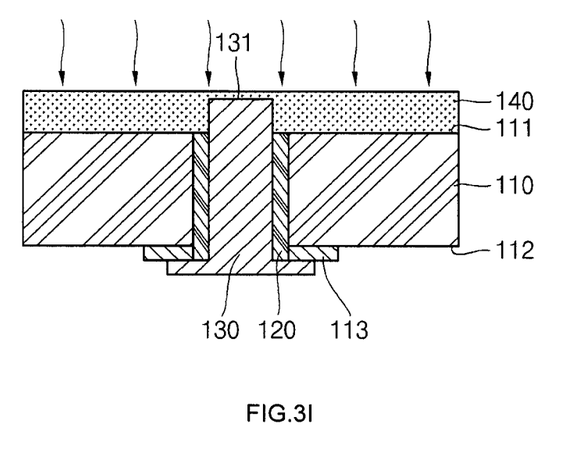

In curing operation S9, as illustrated in FIG. 3I, heat of approximately 100~400° C. is supplied to the remaining dielectric layer 140, thereby curing the dielectric layer 140 to make the same hardened.

Figure 3J:
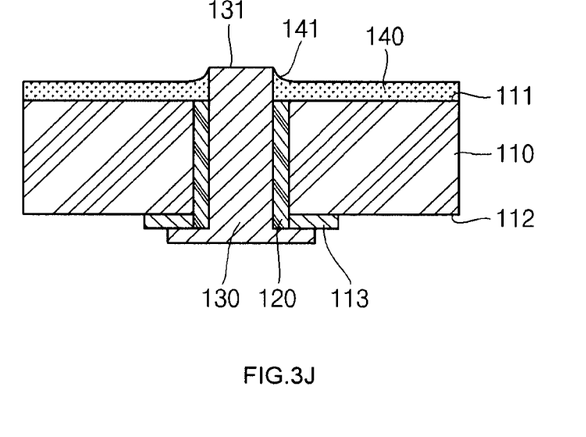

In performing plasma descum process operation S10, as illustrated in FIG. 3J, plasma is supplied to remove the dielectric layer 140 remaining on the top end 131 of the through electrode 130. The plasma slightly etches the dielectric layer 140 remaining on the top end 131 and peripheral edges of the through electrode 130. In addition, in the performing of the plasma descum process, a curved surface 141 having a gradually decreasing thickness is formed on the dielectric layer 140 positioned on the peripheral edges of the through electrode 130. Stated another way, the curved surface 141 surrounds the through electrode 130 such that the thickness of the dielectric layer 140 is greatest at the through electrode 130 and decreases away from the through electrode 130 as demonstrated by the curved surface 141. Optionally, in one embodiment, to enhance vertical stacking of a plurality of semiconductor dies 110, a coating, e.g., plating, is applied to top end 131 such as a nickel-gold (NiAu) plating, a nickel-palladium-gold (NiPdAu) plating, or a tin (Sn) plating or other plating. The coating on top end 131 can also be applied at earlier stages during fabrication or omitted altogether.

As described above, in the semiconductor device 100 according to embodiments, the through electrode 130 can be formed using existing wafer bumping equipment and materials without costly equipment. In addition, in the semiconductor device 100 according to embodiments, since a photolithography process is utilized, the dielectric layer 140 and the through electrode 130, whose surfaces are very clean, can be obtained. Further, the semiconductor device 100 according to embodiments can be manufactured with considerably reduced costs.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A semiconductor device comprising:
   a semiconductor die comprising:
      a first surface;
      a second surface;
      a conductive pad coupled to the second surface; and
      a through-hole formed through the first surface and the conductive pad;
   an insulation layer coupled to an inner wall of the through-hole;
   a through electrode coupled to the insulation layer, the through electrode protruding to an outside of the first surface and the conductive pad, the through electrode covering and directly contacting the conductive pad in a direction parallel to the second surface; and
   a dielectric layer directly contacting the first surface of the semiconductor die while exposing the through electrode to the outside, wherein the dielectric layer comprises a curved surface surrounding the through electrode, the dielectric layer having a decreasing thickness away from the through electrode.

2. The semiconductor device of claim 1, wherein a thickness of the through electrode exposed from the first surface of the semiconductor die is greater than a thickness of the dielectric layer.

3. The semiconductor device of claim 1, wherein the conductive pad and the through electrode are electrically connected to each other.

4. The semiconductor device of claim 1 wherein the insulation layer electrically isolates the through electrode.

5. The semiconductor device of claim 1 wherein the insulation layer is formed of a material different than a material of the dielectric layer.

6. A semiconductor device comprising:
   a semiconductor die comprising a first surface;
   a through electrode extending through the semiconductor die, the through electrode protruding to an outside of the first surface; and
   a dielectric layer directly contacting the first surface of the semiconductor die, the through electrode being exposed from the dielectric layer, wherein the dielectric layer comprises a curved surface surrounding and extending directly from the through electrode such that the dielectric layer has a decreasing thickness in a direction perpendicular to the first surface away from the through electrode, the dielectric layer being between the curved surface and the first surface of the semiconductor die.

7. The semiconductor device of claim 6 further wherein the semiconductor die further comprises:
   a second surface; and
   a conductive pad coupled to the second surface.

8. The semiconductor device of claim 7, wherein the conductive pad and the through electrode are electrically connected to each other.

9. The semiconductor device of claim 7 wherein the through electrode covers the conductive pad.

10. The semiconductor device of claim 6 further comprising an insulation layer electrically isolating the through electrode from a bulk of the semiconductor die.

11. The semiconductor device of claim 10 wherein the through electrode is formed inside of the insulation layer.

12. The semiconductor device of claim 10 wherein the semiconductor die further comprising a through-hole, the insulation layer being formed on an inner wall of the through-hole.

13. A semiconductor device comprising:
   a semiconductor die comprising a first surface;
   a through electrode extending through the semiconductor die; and
   a dielectric layer directly contacting the first surface of the semiconductor die, a top end of the through electrode being exposed from the dielectric layer, wherein the dielectric layer comprises a curved surface surrounding and extending directly from a lateral surface of the through electrode such that the dielectric layer has a decreasing thickness in a direction perpendicular to the first surface away from the through electrode, the dielectric layer being between the curved surface and the first surface of the semiconductor die.

14. The semiconductor device of claim 13 wherein the dielectric layer covers the lateral surface of the through electrode.

15. The semiconductor device of claim 13, wherein a thickness of the through electrode exposed from the first surface of the semiconductor die is greater than a thickness of the dielectric layer.

16. The semiconductor device of claim 13 wherein the semiconductor die further comprises a second surface and a conductive pad coupled to the second surface, the through electrode covering the conductive pad.

* * * * *